(12) United States Patent
Yasuda

(10) Patent No.: US 10,283,515 B2
(45) Date of Patent: May 7, 2019

(54) SEMICONDUCTOR MEMORY DEVICE

(71) Applicant: TOSHIBA MEMORY CORPORATION, Minato-ku (JP)

(72) Inventor: Naoki Yasuda, Mie (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/854,433

(22) Filed: Dec. 26, 2017

(65) Prior Publication Data

US 2018/0138190 A1    May 17, 2018

Related U.S. Application Data

(63) Continuation of application No. 15/456,869, filed on Mar. 13, 2017, now Pat. No. 9,893,075.

(60) Provisional application No. 62/394,795, filed on Sep. 15, 2016.

(51) Int. Cl.
| | |
|---|---|
| *H01L 27/115* | (2017.01) |
| *H01L 27/11556* | (2017.01) |
| *H01L 29/788* | (2006.01) |
| *H01L 29/06* | (2006.01) |
| *H01L 29/423* | (2006.01) |

(52) U.S. Cl.
CPC .... *H01L 27/11556* (2013.01); *H01L 29/0649* (2013.01); *H01L 29/42324* (2013.01); *H01L 29/7889* (2013.01)

(58) Field of Classification Search
CPC .......... H01L 27/11556; H01L 29/7889; H01L 29/42324; H01L 29/0649
See application file for complete search history.

(56) References Cited

U.S. PATENT DOCUMENTS

| | | | |
|---|---|---|---|
| 2010/0181612 A1* | 7/2010 | Kito | H01L 27/11551 257/319 |
| 2012/0091521 A1* | 4/2012 | Goda | H01L 27/11556 257/328 |
| 2014/0160841 A1 | 6/2014 | Koval | |
| 2015/0249092 A1* | 9/2015 | Sakui | H01L 29/7889 438/268 |
| 2018/0053774 A1 | 2/2018 | Sakamoto | |

* cited by examiner

*Primary Examiner* — David Yu
(74) *Attorney, Agent, or Firm* — Oblon, McClelland, Maier & Neustadt, L.L.P.

(57) ABSTRACT

A semiconductor memory device includes a plurality of electrode layers stacked in a first direction; a semiconductor layer of a columnar shape extending through the electrode layers in the first direction; and a plurality of floating gates provided between the electrode layers and the semiconductor layer respectively. The floating gates surround the semiconductor layer. A gate length in a first direction of a floating gate positioned between one of the electrode layers and the semiconductor layer is longer than a layer thickness in the first direction of the one of the electrode layers. A ratio of the layer thickness of the one of the electrode layers to the gate length has a positive correlation with an outer diameter of a first portion of the semiconductor layer surrounded by the floating gate in a second direction from the semiconductor layer toward the one of the electrode layers.

12 Claims, 9 Drawing Sheets

SEMICONDUCTOR MEMORY DEVICE

CROSS-REFERENCE TO RELATED APPLICATIONS

This application is a continuation of U.S. application Ser. No. 15/456,869, filed Mar. 13, 2017 and is based upon and claims the benefit of priority from U.S. Provisional Patent Application 62/394,795 filed on Sep. 15, 2016; the entire contents of which are incorporated herein by reference.

FIELD

Embodiments are generally related to a semiconductor memory device.

BACKGROUND

A semiconductor memory device is under developing, which includes three-dimensionally arranged memory cells. For example, a NAND type memory device includes a plurality of word lines stacked on a base layer and semiconductor layers each provided in a memory hole extending through the word lines. The memory cells are provided at portions respectively, where the semiconductor layers intersect the word lines. In order to increase the memory capacity of such a memory device, it is desirable to increase the number of stacked word lines and increase the density of semiconductor layers in a surface of the word line. Thus, the memory holes are formed deeper in the stacking direction of the word lines, and the diameter thereof is miniaturized. As a result, the uniformity of diameters in the memory holes is lost in the stacking direction, and for example, the memory cell characteristics may have many variations.

DETAILED DESCRIPTION

Figure 1:
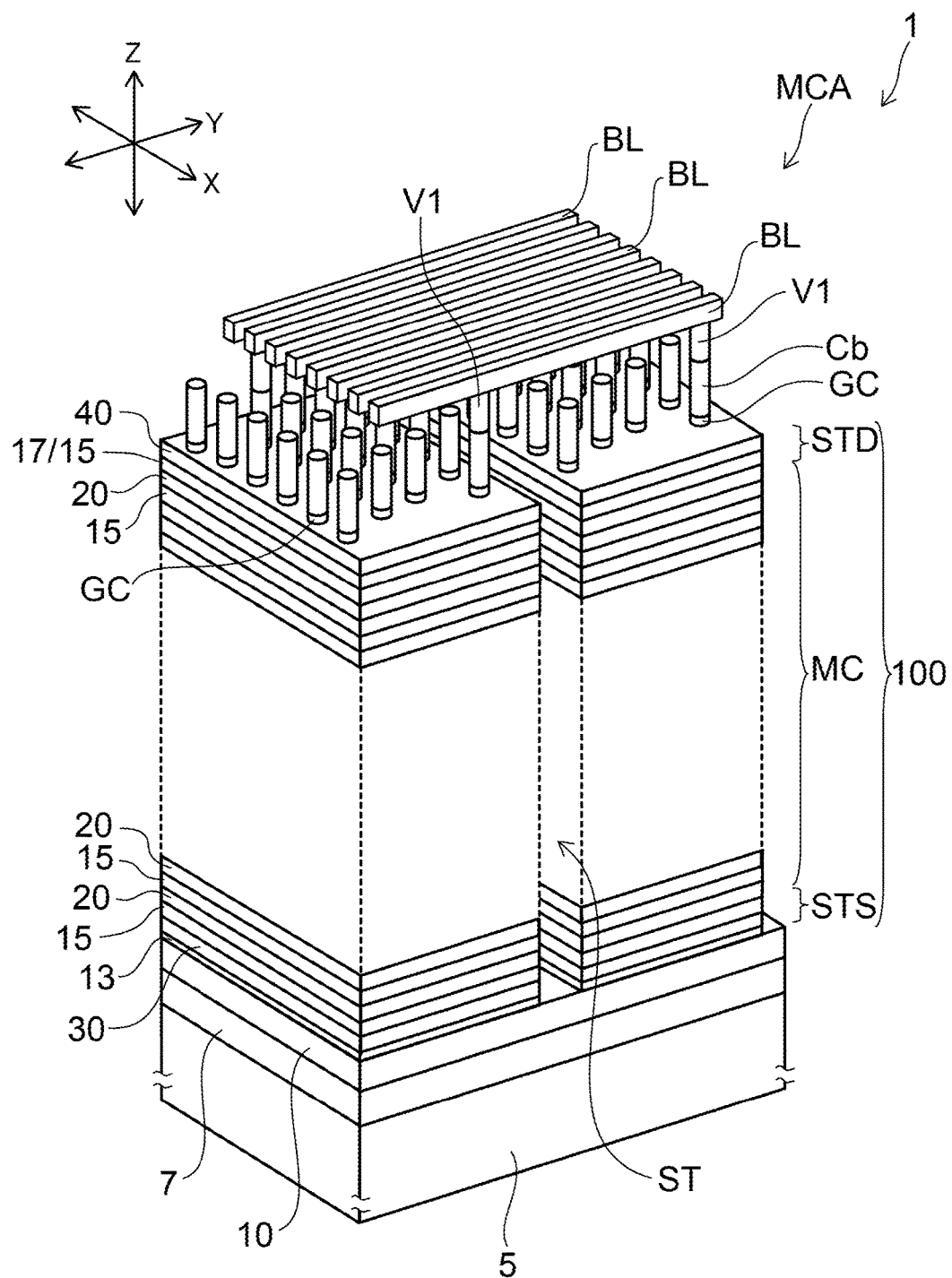
FIG. 1 is a perspective view schematically showing a semiconductor memory device according to an embodiment.

According to one embodiment; a semiconductor memory device includes a plurality of electrode layers stacked in a first direction; a semiconductor layer of a columnar shape extending through the electrode layers in the first direction; and a plurality of floating gates provided between the electrode layers and the semiconductor layer respectively. The floating gates surround the semiconductor layer. A gate length in a first direction of a floating gate positioned between one of the electrode layers and the semiconductor layer is longer than a layer thickness in the first direction of the one of the electrode layers. The semiconductor layer includes a first portion surrounded by the floating gate, and a ratio of the layer thickness of the one of the electrode layers to the gate length has a positive correlation with an outer diameter in a second direction of the first portion of the semiconductor layer, the second direction being directed from the semiconductor layer toward the one of the electrode layers.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 2:
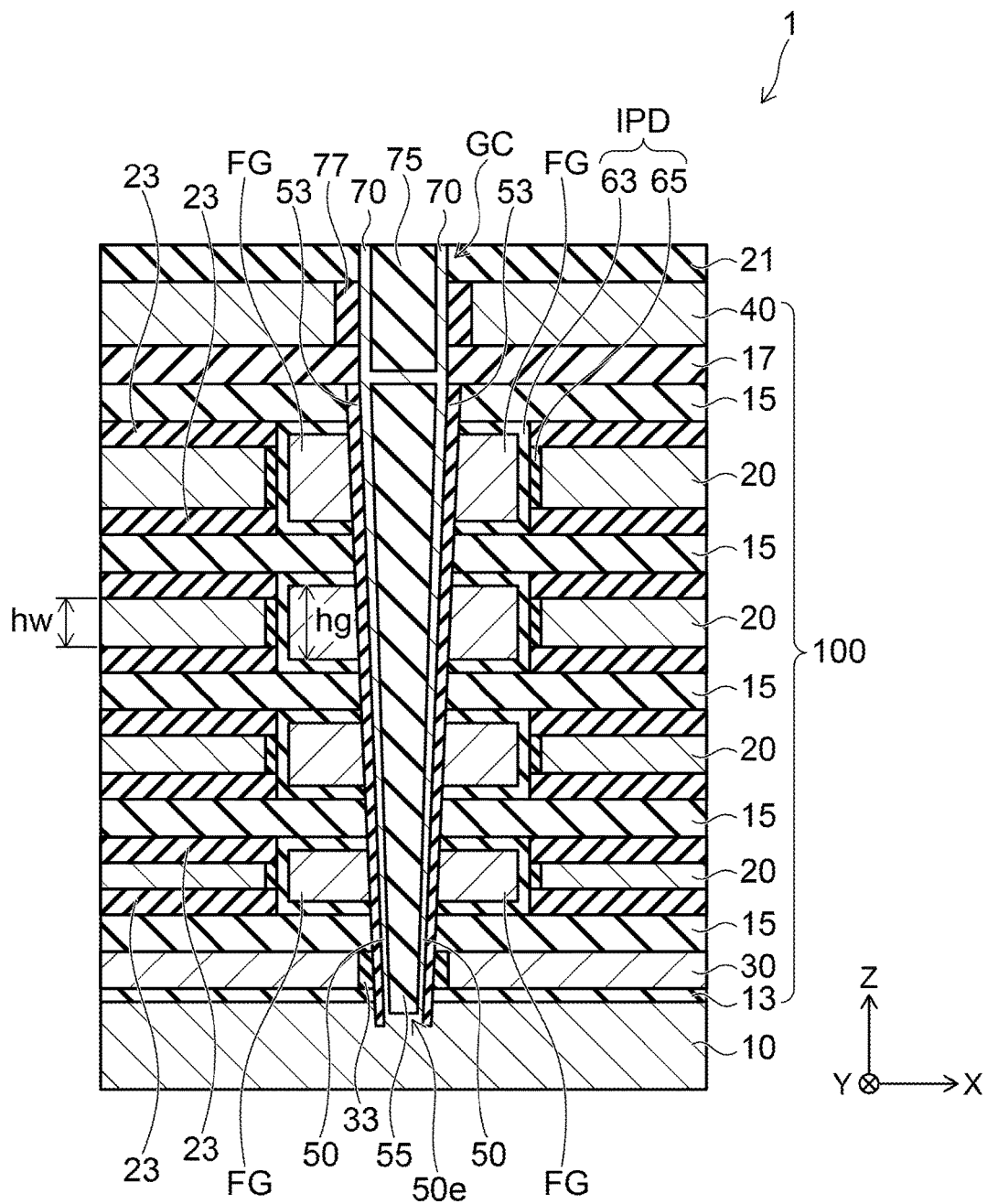
FIG. 2 is a schematic cross-sectional view showing the semiconductor memory device according to the embodiment.

FIGS. 1 and 2 are schematic views schematically showing a memory cell array MCA of a semiconductor memory device 1 according to an embodiment. FIG. 1 is a perspective view of the memory cell array MCA, and FIG. 2 is a schematic view showing a cross section parallel to the Y-Z plane. The semiconductor memory device 1 is, for example, a NAND type memory device and includes three-dimensionally arranged memory cells.

As shown in FIG. 1, the semiconductor memory device 1 includes a conductive layer (hereinafter referred to as a source layer 10) provided on a substrate 5 and a stacked body 100. The source layer 10 is provided on the substrate 5 via the interlayer insulating layer 7. The stacked body 100 includes a plurality of electrode layers (hereinafter, word lines 20, select gates 30 and 40) stacked in the Z-direction. On the source layer 10, a plurality of stacked bodies are disposed, for example, in the Y direction. The adjacent stacked bodies 100 in the Y-direction are separated by the slit space ST.

The selection gate 30 is provided on the source layer 10 with the insulating layer 13 interposed. The word line 20 is stacked on the select gate 30. The insulating layers 15 are provided respectively between the selection gate 30 and the lowermost word line 20 and between the adjacent word lines 20 in the Z direction. The selection gate 40 is provided on the uppermost word line 20 via the insulating layers 15 and 17.

The substrate 5 is, for example, a silicon substrate. The source layer 10 includes, for example, a polycrystalline silicon layer or a metal layer, or both, and is provided with a plate shape extending in the X direction and the Y direction. The word lines 20 and the select gates 30 and 40 are, for example, low resistance polycrystalline silicon layers. The interlayer insulating layer 7, the insulating layers 13, 15 and 17 are, for example, silicon oxide layers. The semiconductor memory device 1 may include a circuit, for driving the memory cells MC, between the substrate 5 and the interlayer insulating layer 7.

The stacked body 100 includes a plurality of semiconductor layers 50 extending through the word lines 20 in the Z direction (see FIG. 2). Furthermore, the stacked body 100 includes a plurality of gate channels GC extending through the select gate 40 in the Z direction. The gate channels GC are electrically connected to the semiconductor layers 50 respectively. In addition, the gate channels GC are electrically connected to the bit lines BL respectively via contact plugs Cb and V 1. In FIG. 1, an interlayer insulating layer 21 and the like provided between the selection gate 40 and the bit lines BL (see FIG. 2) are omitted for convenience in showing the structure of the semiconductor memory device 1.

The bit lines BL extend, for example, in the Y direction above the stacked body 100. The semiconductor layers 50 are electrically connected to the bit lines respectively via the gate channels GC. One of the semiconductor layers 50 provided in the stacked body 100 and one of the semiconductor layers 50 provided in another stacked body 100 share one bit line BL.

As shown in FIG. 2, the memory cell array MCA includes the semiconductor layers 50 extending in the Z direction through the portion where the word lines 20 and the select gate are stacked. Furthermore, a selection gate 40 is provided on the uppermost layer of the word lines 20 via insulating layers 15 and 17, and includes the gate channels GC extending through the selection gate 40. The memory cells MC are provided at portions respectively where the semiconductor layers 50 intersect the word lines 20, and source side selection transistors STS are provided at portions where the semiconductor layers 50 intersect the selection gate 30 (see FIG. 1). Drain side selection transistors STD are provided at portions where the gate channels GC intersect the selection gate 40 (see FIG. 1). In FIG. 2, the number of word lines 20 is reduced for convenience in illustrating.

A semiconductor layer 50 is provided with a columnar shape surrounding a lateral surface of the core body 55. The core body 55 is a columnar insulator extending in the Z-direction through the word lines 20. The semiconductor layer 50 is electrically connected to the source layer 10 at the bottom end 50e thereof.

A memory cell MC includes a floating gate FG located between a word line 20 and a semiconductor layer 50. The floating gate FG is electrically insulated from the semiconductor layer 50 by the insulating layer 53. The insulating layer 53 acts as a tunneling insulator layer of the memory cell MC. Moreover, the floating gate FG is electrically insulated from the word line 20 by IPD (Inter-poly Dielectric). The IPD includes, for example, an insulating layer 63 and an insulating layer 65. The IPD acts as a blocking insulator layer, for example.

A gate channel GC includes a semiconductor layer 70 and a core 75. The core 75 is a columnar insulator extending through the selection gate 40 in the Z direction. The semiconductor layer 70 is formed so as to surround the lateral surface of the core 75 and is positioned between the selection gate 40 and the core 75. The semiconductor layer 70 extends in the Z direction along the core 75 and is electrically connected to the semiconductor layer 50 at the bottom end thereof. Moreover, an insulating layer 77 is provided between the selection gate 40 and the semiconductor layer 70. The insulating layer 77 acts as a gate insulating film of a selection transistor STD.

The semiconductor memory device 1 according to the embodiment includes a spacer insulating layer 23 provided between an insulating layer 15 and a word line 20. In the semiconductor memory device 1, the layer thickness hw (the thickness in the Z direction) of the word line 20 can be changed by adjusting the layer thickness of the spacer insulating layer 23. For example, the combined thickness of the word line 20 and spacer insulating layers 23 provided above and below the word line 20 is substantially the same as the combined thickness in the Z direction of the floating gate FG and parts of the insulating layer 63 positioned above and below the floating gate FG. Therefore, when making the layer thickness of the spacer insulating layer 23 thicker than the layer thickness of the insulating layer 63, it is possible to make the layer thickness hw in the Z direction of the word line 20 thinner than the gate length hg (the length in the Z direction) of the floating gate FG. (see U.S. Pat. No. 8,878, 279 B2)

Figure 3:
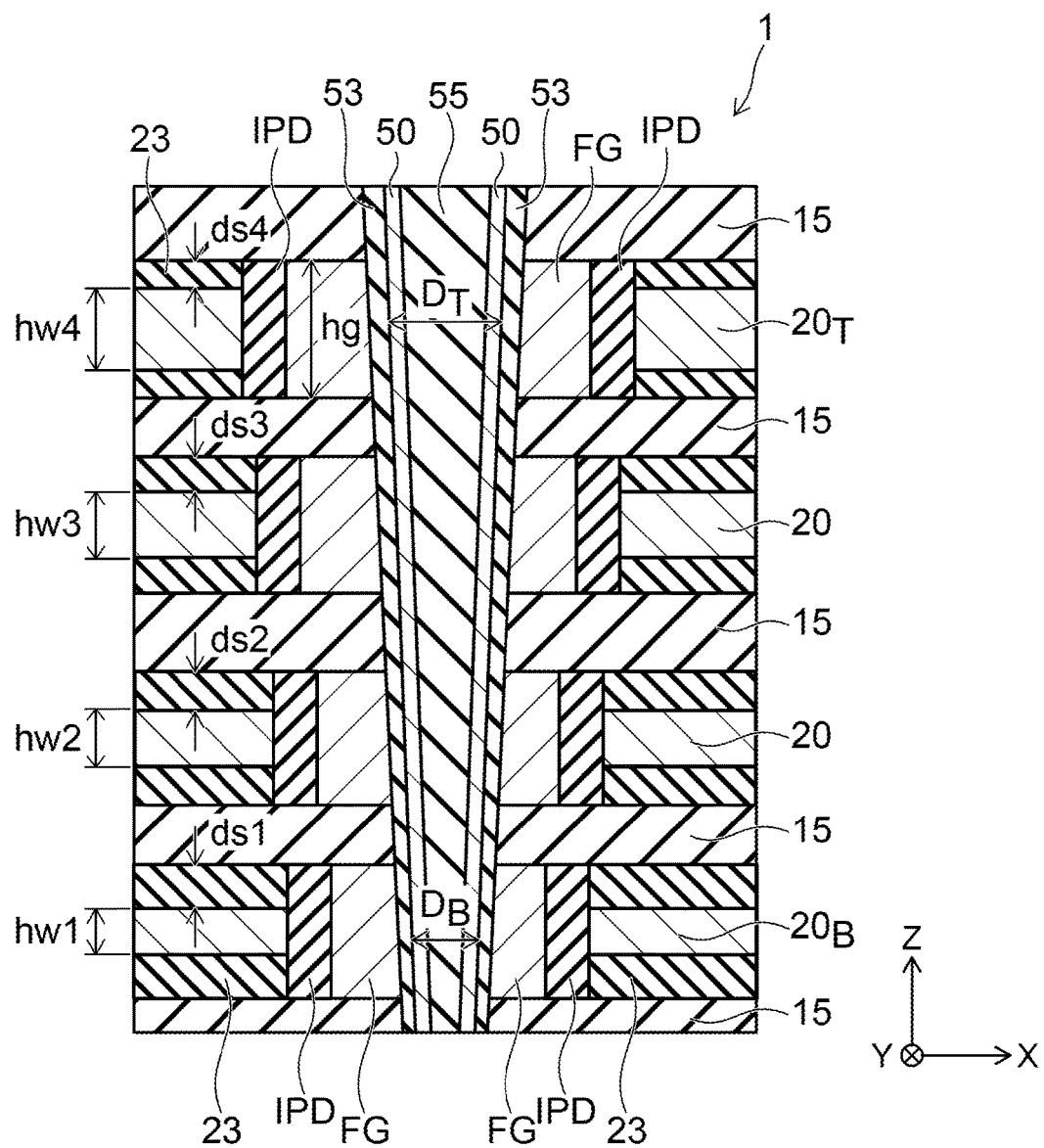
FIG. 3 is a partial cross-sectional view schematically showing the semiconductor memory device according to the embodiment.
Figure 4:
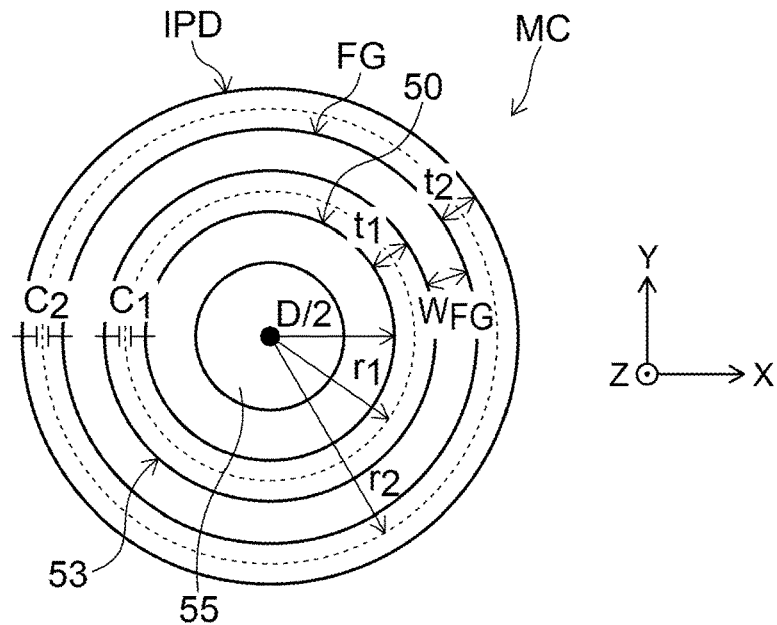
FIG. 4 is a cross-sectional view schematically showing a memory cell of the semiconductor memory device according to the embodiment.
Figure 5:
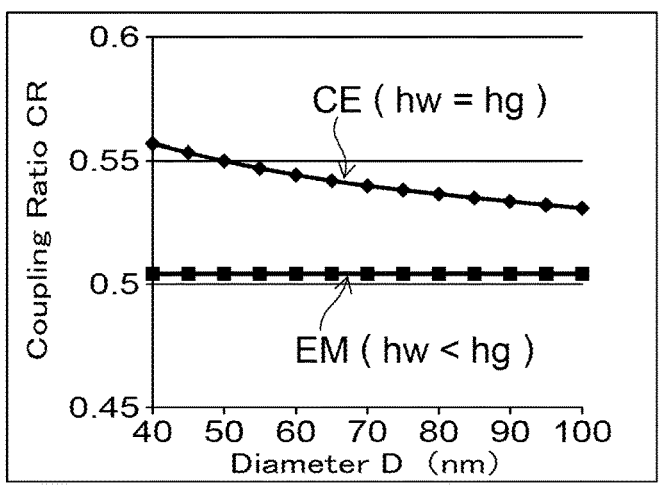
FIG. 5 is a graph showing the characteristics of the semiconductor memory device according to the embodiment.
Figure 6:
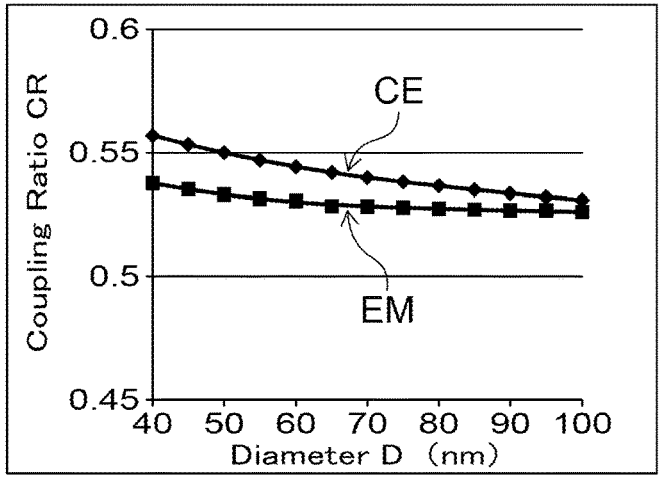
FIG. 6 is a graph showing other characteristics of the semiconductor memory device according to the embodiment.

FIG. 3 is a partial cross-sectional view schematically showing the word lines 20, the semiconductor layer 50 and the floating gates FG of the semiconductor memory device 1. FIG. 4 is a schematic view showing a cross section parallel to the X-Y plane of the memory cell MC. FIGS. 5 and 6 are graphs showing a coupling ratio CR of the memory cell MC.

Hereinbelow, the coupling ratio CR of the memory cell MC is described with reference to FIGS. 3 to 6, based on the relationships with the thickness hw of word line 20, the outer diameter D of semiconductor layer 50 and the gate length hg of floating gate FG.

As shown in FIG. 3, the outer diameter D of the semiconductor layer 50 in the direction from the semiconductor layer 50 to the word line 20 (for example, in the X direction) is not uniform, and the semiconductor layer 50 is formed, for example, to have a diameter D increasing in the Z direction. That is, the outer diameter $D_T$ of a portion extending through the uppermost word line $20_T$ is larger than the outer diameter $D_B$ of a portion extending through the lowermost word line $20_6$.

On the other hand, the gate length hg of the floating gate FG is uniformly provided. Moreover, the word lines 20 are formed so as to have a layer thickness hw increasing in the Z direction such as hw1<hw2<hw3<hw4. The spacer insulating layer 23 is formed, for example, such that the layer thickness $d_s$ (i.e. the thickness in the Z direction) decreases in the Z direction as $d_{s1}>d_{s2}>d_{s3}>d_{s4}$. That is, the layer thickness $d_s$ of the spacer insulating layer 23 has a negative correlation with the outer diameter D of the semiconductor layer 50.

As shown in FIG. 4, for example, the memory cell MC has a substantially concentric circular structure centered on the core body 55. The semiconductor layer 50 is provided so as to surround the core body 55, and the floating gate FG is provided so as to surround the semiconductor layer 50. The insulating layer 53 electrically insulates the semiconductor layer 50 and the floating gate FG from each other. The IPD is provided so as to surround the floating gate FG.

As shown in FIG. 4, when the radius of the insulating layer 53 is $r_1$, the thickness of the insulating layer 53 is $t_1$ (i.e. the thickness in the X direction and the Y direction), the radius of the IPD is $r_2$ and the thickness of the IPD is $t_2$ (i.e. the thickness in the X direction and the Y direction), the capacitance $C_1$ of the insulating layer 53 and the capacitance $C_2$ of the IPD are expressed by the equations (1) and (2).

$$C_1 = \epsilon_1 \frac{2\pi r_1 hg}{t_1} \quad (1)$$

$$C_2 = \epsilon_2 \frac{2\pi r_2 hw}{t_2} \quad (2)$$

Here, $\epsilon_1$ is the dielectric constant of the insulating layer 53, and $\epsilon_2$ is the dielectric constant of IPD. Also, $r_1$ is $(D+t_1)/2$, and $r_2$ is $r_1+[(t_1+2W_{FG}+t_2)/2]$. D is the outer diameter of the semiconductor layer 50, and $W_{FG}$ is the thickness of the floating gate FG in the X direction and the Y direction.

The cross section of the memory cell MC is not limited to a circular shape as shown in FIG. 4, but may be, for example, an ellipse or a square. In such a case, a diameter of exact circle that has an area equal to the cross section of the semiconductor layer 50 including the core body 55 is used as the outer diameter D. In other words, the outer diameter is approximated by the diameter of exact circle that has the same area as an area inside the outline of the semiconductor layer 50 in the cross-section of the memory cell MC orthogonal to the Z direction. Thereby, it is possible to approximate the capacitances $C_1$ and $C_2$ by the diameter of exact circle.

FIG. 5 is a graph showing the relationship between the coupling ratio CR of the capacitors $C_1$ and $C_2$ in the memory cell MC and the outer diameter D of the semiconductor layer 50. The coupling ratio CR is approximated, for example, by the equation (3).

$$CR = \frac{\frac{1}{C_1}}{\frac{1}{C_1} + \frac{1}{C_2}} = \frac{1}{1 - \frac{\epsilon_1}{\epsilon_2} \frac{t_2}{t_1} \frac{r_1}{r_2} \frac{hg}{hw}} \quad (3)$$

"EM" shown in FIG. 5 denotes the characteristics of the memory cell MC having the structure shown in FIG. 3, and "CE" denotes the characteristics of the memory cell MC according to the comparative example.

In the memory cell MC according to the comparative example, the layer thickness hw of the word line 20 is equal to the gate length hg of the floating gate FG, and is constant with respect to the change of the outer diameter of the semiconductor layer 50. Thus, as shown by CE in FIG. 5, the coupling ratio CR decreases as the outer diameter D of the semiconductor layer 50 increases. In contrast, in the embodiment, as shown by EM in FIG. 5, it is possible to make the coupling ratio CR to be constant with respect to the outer diameter D of the semiconductor layer 50.

For example, when the thickness $t_1$ of the insulating layer 53 and the thickness $t_2$ of the IPD are constant in the equation (3), and the relationship of the equation (4) is satisfied, the coupling ratio CR becomes constant.

$$\frac{r_1}{r_2} \frac{hg}{hw} = \frac{1}{k} \text{ (k: const.)} \quad (4)$$

$$\frac{hw}{hg} = k\frac{r_1}{r_2} = k\frac{1}{1 + \frac{2W_{FG} + t_1 + t_2}{D + t_1}} \quad (5)$$

Moreover, the equation (4) can be expressed as the equation (5) by transforming. Here, it is found that there is a positive correlation between the outer diameter D of the semiconductor layer 50 and the layer thickness hw of the word line 20, when the gate length hg of the floating gate FG is constant.

FIG. 6 is another graph showing the relationship between the coupling ratio CR in the memory cell MC and the outer diameter D of the semiconductor layer 50. "CE" shown in FIG. 6 denotes the characteristics of the memory cell according to the comparative example same as in FIG. 5.

For example, in the structure shown in FIG. 3, although the layer thickness hw of the word line 20 is not provided so as to strictly satisfy the relation of equation (4), when the layer thickness hw of the word line 20 has a positive correlation with the outer diameter of the semiconductor layer 50, the coupling ratio CR shows the characteristic denoted by "EM" in FIG. 6. That is, it is found that when the positive correlation exists between the layer thickness hw of the word line 20 and the outer diameter D of the semiconductor layer 50, it is possible to suppress a change of the coupling ratio CR. Thereby, a variation of threshold voltage can be reduced, for example, in the memory cell MC.

Figure 7:
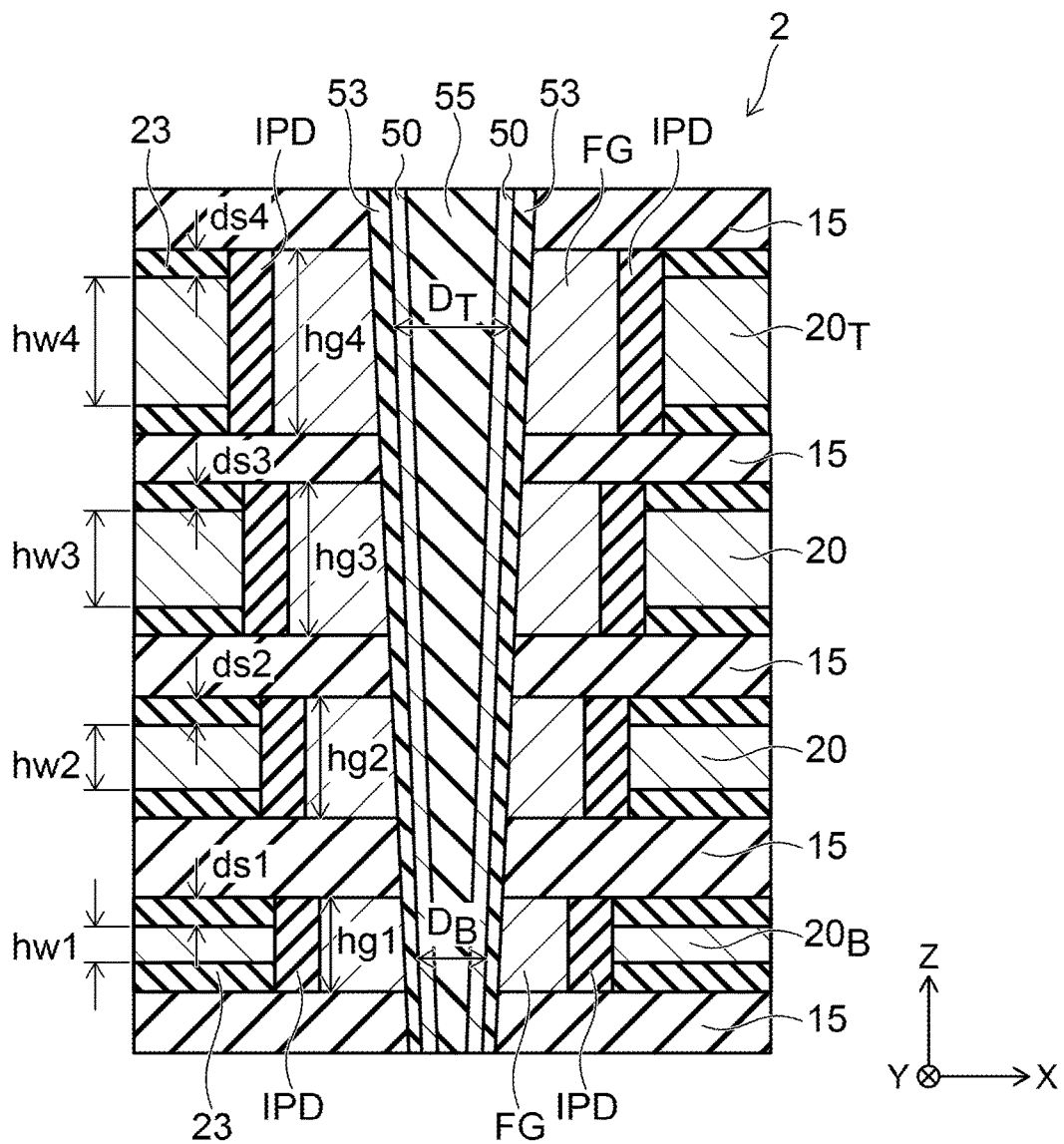
FIG. 7 is a schematic cross-sectional view showing a semiconductor memory device according to a variation of the embodiment.

FIG. 7 is a schematic cross-sectional view showing a semiconductor memory device 2 according to a variation of the embodiment. As shown in FIG. 7, the semiconductor layer 50 is formed such that the outer diameter D thereof increases in the Z direction. The outer diameter $D_T$ at the portion intersecting the uppermost word line $20_T$ is larger than the outer diameter $D_B$ at a portion intersecting with the lowermost word line $20_6$.

The word lines 20 disposed along the semiconductor layer 50 are provided with the layer thickness hw increasing as hw1<hw2<hw3<hw4 in the Z direction. Further, the floating gates FG are also provided with the gate length hg increasing as hg1<hg2<hg3<hg4 in the Z direction. In this case, the spacer insulating layer 23 is formed to have a constant layer thickness such as (ds1=ds2=ds3=ds4).

Also in this example, when the layer thickness hw of the word line 20 and the gate length hg of the floating gate FG satisfy the relationship of equation (4), the coupling ratio CR is constant without the dependency on the outer diameter D of the semiconductor layer 50. Then, when the positive correlation exists between the ratio of the layer thickness hw of the word line 20 to the gate length hg of the floating gate FG and the outer diameter D, it is possible to suppress a change of coupling ratio CR which depends on the outer diameter D of the semiconductor layer 50.

Figure 8A:
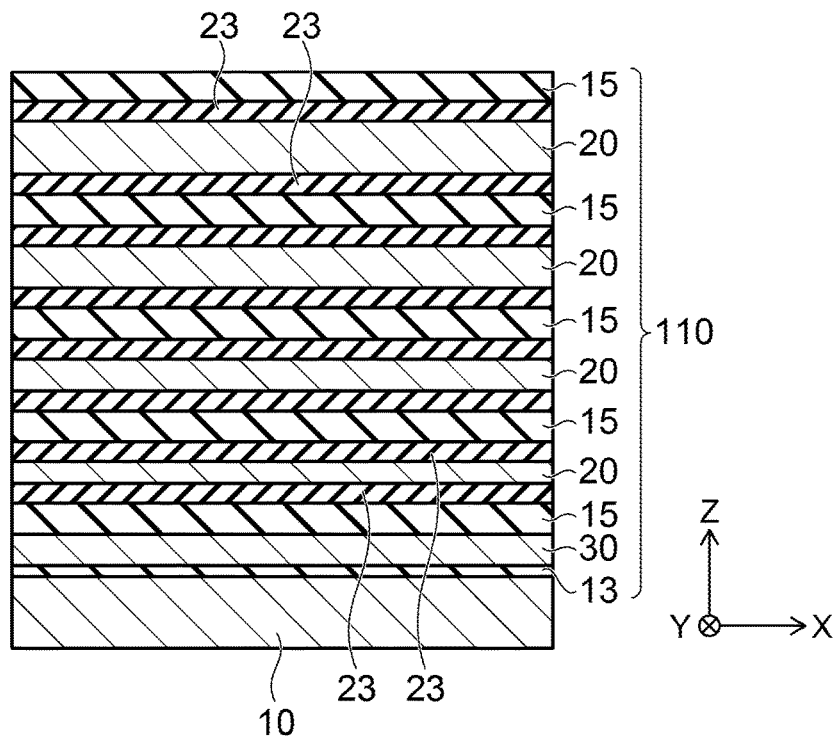
FIGS. 8A to 8G are schematic cross-sectional views showing a manufacturing process of the semiconductor memory device according to the embodiment.

Hereinafter, a manufacturing method of the semiconductor memory device 1 according to the embodiment will be described with reference to FIGS. 8A to 8 G. FIGS. 8A to 8G are schematic cross-sectional views showing a manufacturing process of the semiconductor memory device 1.

As shown in FIG. 8A, a stacked body 110 is formed on a source layer 10. The stacked body 110 includes a plurality of word lines 20 and a select gate 30. The word lines 20 and the select gate 30 are, for example, low-resistance polycrystalline silicon layers deposited using CVD (Chemical Vapor Deposition). The select gate 30 includes, for example, a dopant different from that of the word lines 20, and is formed so that the word lines 20 can be selectively removed.

The selection gate 30 is formed on the source layer 10 with an insulating layer 13 interposed. The word lines 20 are stacked on the select gate 30 with insulating layers 15 interposed respectively. Moreover, a spacer insulating layer 23 is formed between each word line 20 and an insulating layer 15. The insulating layers 13 and 15 are, for example, silicon oxide layers, and the spacer insulating layer 23 is, for example, a silicon nitride layer.

Figure 8B:
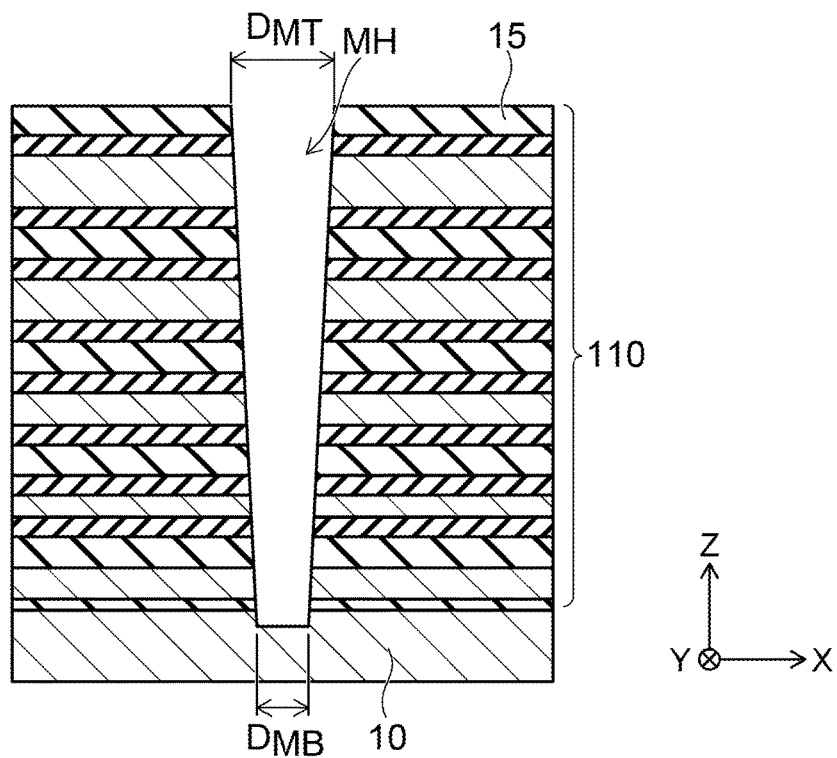

As shown in FIG. 8B, a memory hole MH is formed so as to extend from the top surface of the stacked body 110 to the source layer 10. The memory hole MH is formed, for example, by selectively etching the stacked body 110 using anisotropic RIE (Reactive Ion Etching). The memory hole MH is formed, for example, in a tapered shape such that the diameter $D_{MB}$ of the bottom surface is narrower than the diameter $D_{MT}$ of the opening due to etching properties.

Figure 8C:
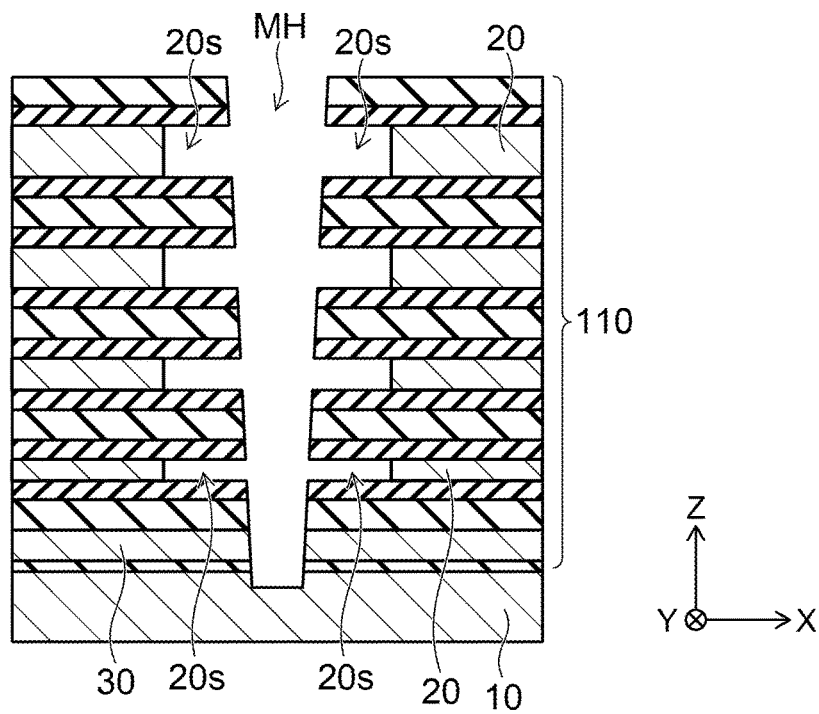

As shown in FIG. 8C, the word lines 20 exposed in an inner wall of the memory hole MH are etched to form recessed portions 20s which have recessed end faces of the word lines 20. The word line 20 is etched under the condition where the select gate 30 is not etched.

Figure 8D:
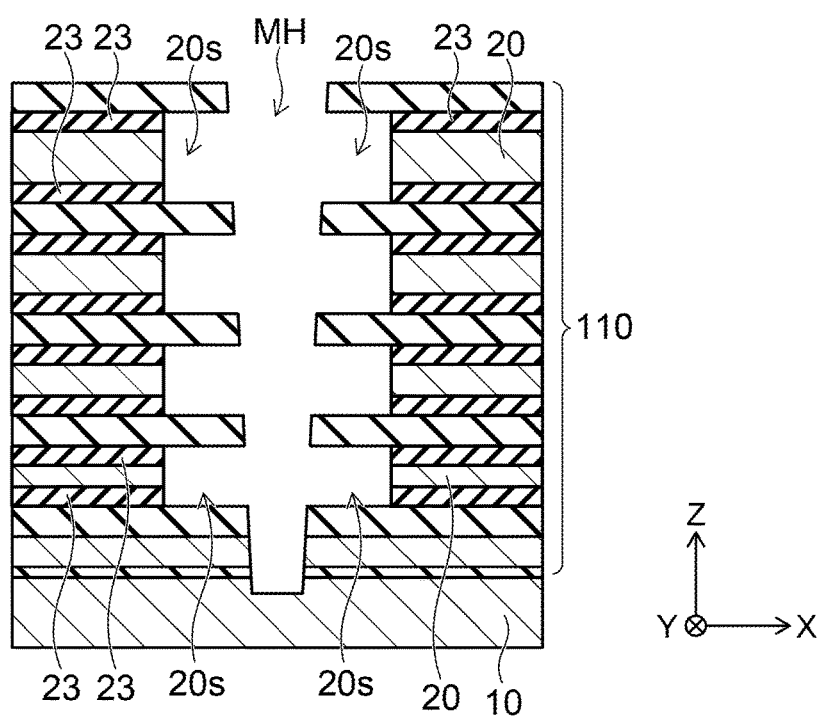

As shown in FIG. 8D, the spacer insulating layers 23 exposed in the recess portions 20s are selectively removed. The spacer insulating layers 23 are selectively removed, for example, by wet etching using hot phosphoric acid.

Figure 8E:
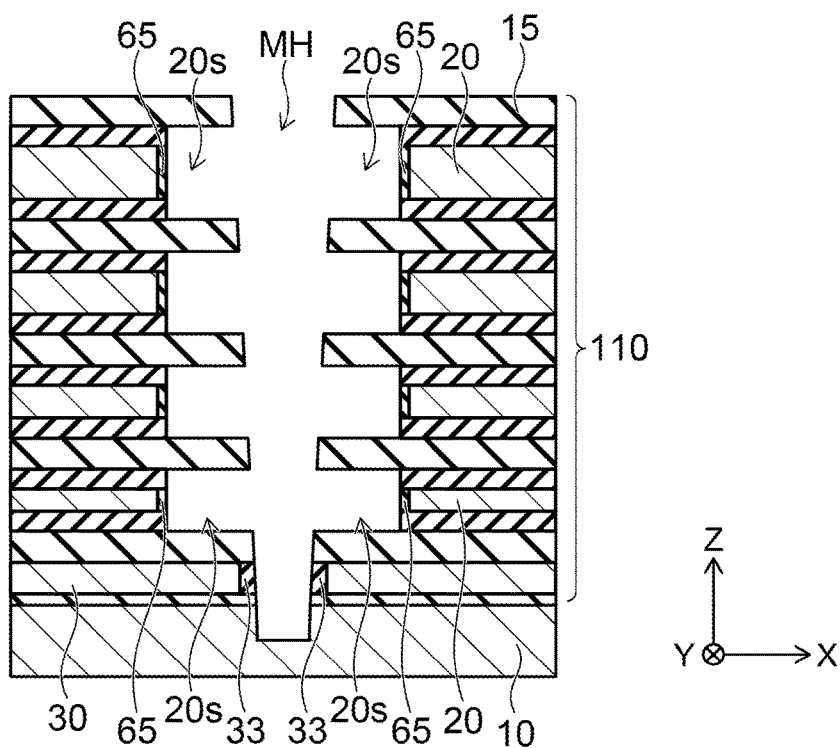

As shown in FIG. 8E, the word lines 20 exposed in the recessed portions 20s and the select gate 30 exposed at a bottom portion of the memory hole MH are thermally oxidized, for example, and insulating layers 33 and 65 are formed on the end face thereof. The insulating layers 33 and 65 are, for example, silicon oxide layers. Also, the source layer 10 exposed on the bottom surface of the memory hole MH is oxidized, and an oxide layer is formed on the surface thereof. This oxide layer is selectively removed, for example, using anisotropic RIE.

Figure 8F:
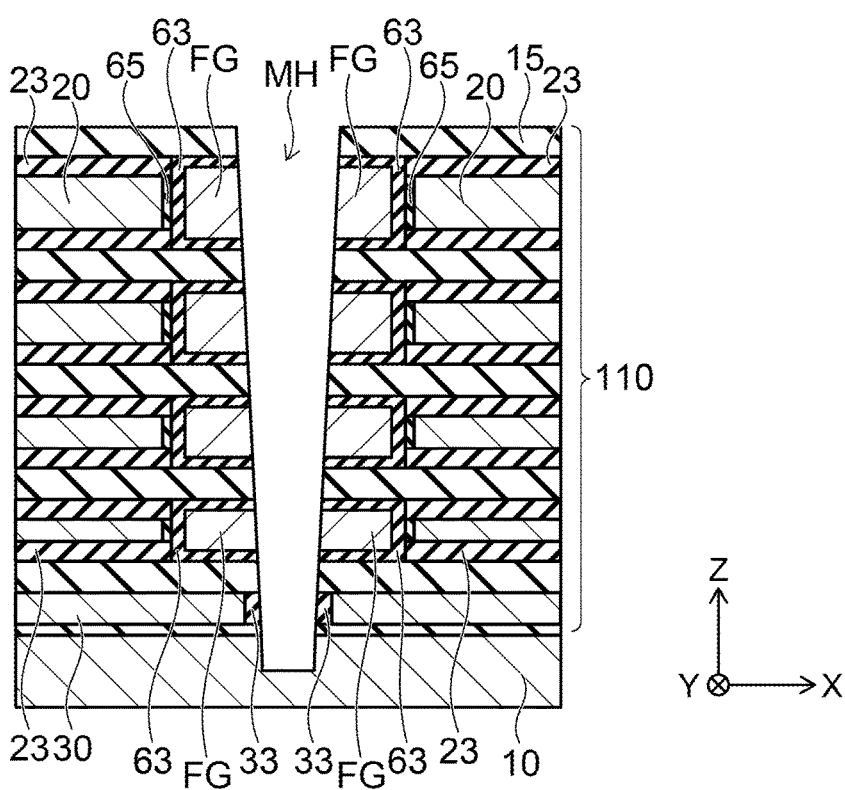

As shown in FIG. 8F, the insulating layers 63 and the floating gates FG are formed in the recess portions 20s. The insulating layers 63 have a structure, for example, in which a silicon nitride film and a silicon oxide film are stacked from a side of an insulating layer 65. In addition, the insulating layer 63 may partially contain a high dielectric constant material such as aluminum oxide or hafnium oxide. A floating gate FG includes, for example, polycrystalline silicon. An insulating layer 63 is formed to be thinner than a layer thickness (i.e. thickness in the Z direction) of a spacer insulating layer 23, for example. Thereby, a gate length hg of the floating gate FG is formed to be longer than the layer thickness hw of the word line 20.

The insulating layer 63 and the floating gate FG are formed, for example, by depositing the stacked structure of a silicon nitride film, a silicon oxide film and a polycrystalline silicon layer in a recess portion 20s via the memory hole MH. Thereafter, the silicon nitride film, the silicon oxide film, and the polycrystalline silicon layer deposited on the end face of the insulating layer 15 are removed, for example, by isotropic dry etching. Thereby, it is possible to form the floating gates FG which are disposed to be separated from each other in the Z direction.

Figure 8G:
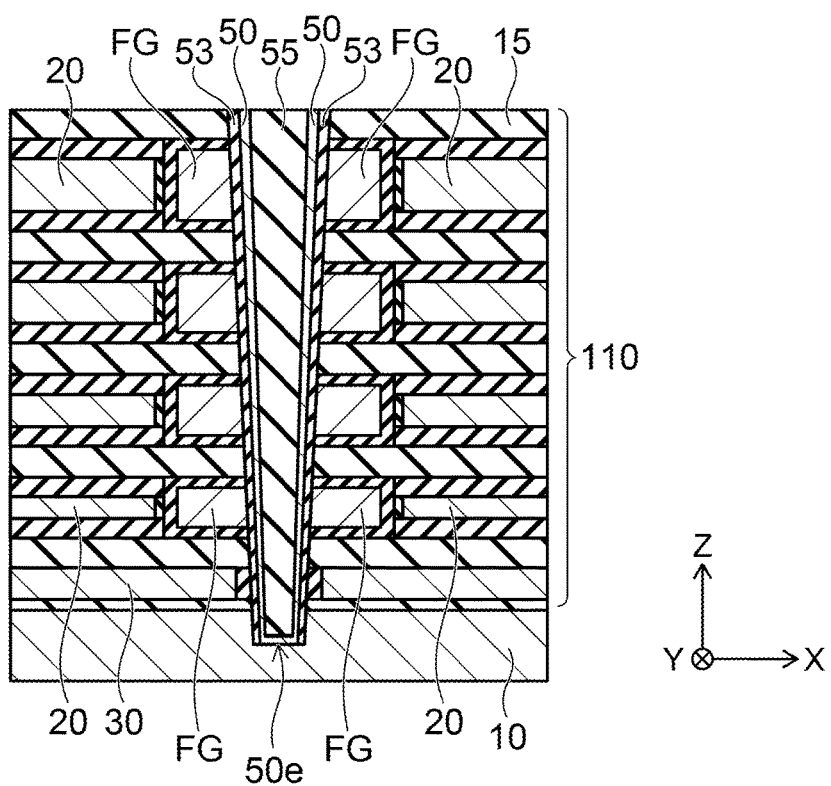

As shown in FIG. 8G, the insulating layer 53 is formed so as to cover the inner wall of the memory hole MH. The insulating layer 53 is formed so as to cover the inner surface of the memory hole MH, for example, and then, a portion formed on the bottom surface of the memory hole MH is selectively removed using anisotropic RIE. Moreover, the semiconductor layer 50 is formed so as to cover the inner surface of the memory hole MH. Thereby, the semiconductor layer 50 is electrically connected to the source layer 10 at a bottom end 50e thereof. Subsequently, a core body 55 is formed to fill the inside of the memory hole MH.

The insulating layer 53 is, for example, a silicon oxide layer formed using ALD (Atomic Layer Deposition). The semiconductor layer 50 is, for example, a polycrystalline silicon layer formed using CVD. The core body 55 is, for example, a silicon oxide layer formed using CVD.

Subsequently, the selection gate 40 and the gate channel GC are formed on the stacked body 110 to complete the memory cell array MCA (see FIG. 2).

In the embodiment, by forming the spacer insulating layer 23 between the interlayer insulating film (an insulating layer 15) and the word line 20, the floating gate FG is formed to have the gate length hg longer than the layer thickness hw of the word line 20. Furthermore, the word line 20 is formed so as to have a layer thickness corresponding to the outer diameter of the semiconductor layer 50. Thus, it is possible to suppress variations in the coupling ratio of memory cell MC and to uniform the characteristics in the memory cell MC.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
   a plurality of electrode layers stacked in a first direction, the electrode layers including a first electrode layer and a second electrode layer, the first electrode layer having a first layer thickness in the first direction, the second electrode layer having a second layer thickness in the first direction, the first layer thickness being smaller than the second layer thickness;
   a semiconductor layer of a columnar shape extending through the electrode layers in the first direction, the semiconductor layer having a first portion surrounded by the first electrode layer and a second portion surrounded by the second electrode layer, the first portion having a first outer diameter in a second direction crossing the first direction, the second direction being defined as a direction toward the first electrode layer from the first portion, the second portion having a second outer diameter in the second direction, the first outer diameter being smaller than the second outer diameter; and
   a plurality of floating gates provided between the electrode layers and the semiconductor layer respectively, the floating gates surrounding the semiconductor layer, the floating gates including a first floating gate and a second floating gate, the first floating gate being positioned between the first electrode layer and the first portion of the semiconductor layer, the first floating gate having a first gate length in the first direction larger than the first layer thickness, the second floating gate being positioned between the second electrode layer and the second portion of the semiconductor layer, the second floating gate having a second gate length in the first direction larger than the second layer thickness.

2. The semiconductor memory device according to claim 1, wherein a ratio of the first layer thickness to the first gate length is smaller than a ratio of the second layer thickness to the second gate length.

3. The semiconductor memory device according to claim 1, wherein
   the electrode layers further include a third electrode layer positioned between the first electrode layer and the second electrode layer, the third electrode layer having a third layer thickness in the first direction, the third layer thickness being larger than the first layer thickness and being smaller than the second layer thickness;

the semiconductor layer further includes a third portion surrounded by the third electrode layer; the third portion having a third outer diameter in the second direction, the third outer diameter being larger than the first outer diameter and being smaller than the second outer diameter; and the floating gates further includes a third floating gate positioned between the third electrode layer and the third portion of the semiconductor layer, the third floating gate having a third gate length in the first direction, the third gate length being larger than the third layer thickness.

4. The semiconductor memory device according to claim 3, wherein a ratio of the first layer thickness to the first gate length is smaller than a ratio of the third layer thickness to the third gate length, and the ratio of the third layer thickness to the third gate length is smaller than a ratio of the second layer thickness to the second gate length.

5. The semiconductor memory device according to claim 4, wherein the first gate length, the second gate length and the third gate length are substantially equal.

6. The semiconductor memory device according to claim 4, wherein the first gate length is shorter than the third gate length, and the third gate length is shorter than the second gate length.

7. The semiconductor memory device according to claim 1, wherein the first to third outer diameters each are approximated by a diameter of exact circle that has an area same as an area inside an outline of the semiconductor layer in a cross-section orthogonal to the first direction.

8. The semiconductor memory device according to claim 1, further comprising:

a plurality of interlayer insulating layers provided respectively between the electrode layers; and a plurality of spacer insulating layers provided respectively between the electrode layers and the interlayer insulating layers, wherein the interlayer insulating layers including a first interlayer insulating layer and a second interlayer insulating layer, the first electrode layer being positioned between the first interlayer insulating layer and the second interlayer insulating layer, the spacer insulating layers including a first spacer insulating layer and a second spacer insulating layer, the first spacer insulating layer being positioned between the first electrode layer and the first interlayer insulating layer, the second spacer insulating layer being positioned between the first electrode layer and the second interlayer insulating layer, and a total length in the first direction of a combination of the first electrode layer together with the first spacer insulating layer and the second spacer insulating layer being longer than the first gate length of the first floating gate.

9. The semiconductor memory device according to claim 8, wherein layer thicknesses in the first direction of the spacer insulating layers are substantially equal.

10. The semiconductor memory device according to claim 8, wherein the spacer insulating layers further include a third spacer insulating layer and a fourth spacer insulating layer, the second electrode layer being positioned between the third spacer insulating layer and the fourth spacer insulating layer; and the third spacer insulating layer and the fourth spacer layer have layer thicknesses in the first direction smaller than layer thicknesses in the first direction of the first spacer insulating layer and the second spacer insulating layer.

11. The semiconductor memory device according to claim 8, wherein a material comprising the spacer insulating layers is different from a material comprising the interlayer insulating layers.

12. The semiconductor memory device according claim 8, further comprising:

a blocking insulator layer provided between the first electrode layer and the first floating gate, wherein the first floating gate is positioned between the first interlayer insulating layer and the second interlayer insulating layer, the blocking insulator layer includes a first layer provided on an end face of the first electrode layer facing the first floating gate, and a second layer having a portion positioned between the first layer and the first floating gate, the second layer extends between the first floating gate and the first interlayer insulating layer and between the first floating gate and the second interlayer insulating layer, and a layer thickness of the second layer is thinner than a layer thickness of the first spacer insulating layer and a layer thickness of the second spacer insulating layer.

* * * * *